(12) United States Patent
Nguyen et al.

(10) Patent No.: US 7,060,638 B2
(45) Date of Patent: Jun. 13, 2006

(54) METHOD OF FORMING LOW DIELECTRIC CONSTANT POROUS FILMS

(75) Inventors: Son Van Nguyen, Los Gatos, CA (US); Hichem M'Saad, Santa Clara, CA (US); Bok Hoen Kim, San Jose, CA (US)

(73) Assignee: Applied Materials, Santa Clara, CA (US)

( * ) Notice: Subject to any disclaimer, the term of this patent is extended or adjusted under 35 U.S.C. 154(b) by 63 days.

(21) Appl. No.: 10/808,231

(22) Filed: Mar. 23, 2004

(65) Prior Publication Data

US 2005/0215065 A1    Sep. 29, 2005

(51) Int. Cl.
*H01L 21/469*    (2006.01)
*H01L 21/31*    (2006.01)

(52) U.S. Cl. .................................................. 438/787
(58) Field of Classification Search ................ 438/787
See application file for complete search history.

(56) References Cited

U.S. PATENT DOCUMENTS

| | | | | |
|---|---|---|---|---|
| 5,324,539 A | * | 6/1994 | Maeda et al. | 427/255.35 |
| 5,510,645 A | | 4/1996 | Fitch et al. | |
| 5,864,172 A | * | 1/1999 | Kapoor et al. | 257/634 |
| 5,976,478 A | * | 11/1999 | Swanson et al. | 423/335 |
| 6,057,251 A | | 5/2000 | Goo et al. | |
| 6,147,009 A | | 11/2000 | Grill et al. | |
| 6,312,793 B1 | | 11/2001 | Grill et al. | |
| 6,437,443 B1 | | 8/2002 | Grill et al. | |
| 6,441,491 B1 | | 8/2002 | Grill et al. | |
| 6,479,110 B1 | | 11/2002 | Grill et al. | |
| 6,495,479 B1 | | 12/2002 | Wu et al. | |
| 6,528,153 B1 | | 3/2003 | Benzing et al. | |
| 6,541,367 B1 | | 4/2003 | Mandal | |
| 6,541,398 B1 | | 4/2003 | Grill et al. | |
| 6,559,070 B1 | | 5/2003 | Mandal | |
| 6,582,777 B1 | | 6/2003 | Ross et al. | |
| 6,583,048 B1 | | 6/2003 | Vincent et al. | |
| 6,596,627 B1 | | 7/2003 | Mandal | |
| 6,605,549 B1 | | 8/2003 | Leu et al. | |
| 6,645,878 B1 | | 11/2003 | Smith et al. | |
| 6,737,365 B1 | | 5/2004 | Kloster et al. | |
| 6,756,323 B1 | | 6/2004 | Grill et al. | |
| 6,770,573 B1 | | 8/2004 | Grill et al. | |
| 6,780,499 B1 | * | 8/2004 | Gates et al. | 428/315.7 |
| 6,790,789 B1 | | 9/2004 | Grill et al. | |
| 6,846,515 B1 | | 1/2005 | Vrtis et al. | |
| 6,890,639 B1 | | 5/2005 | Mandal | |
| 2002/0034625 A1 | | 3/2002 | Grill et al. | |
| 2002/0037442 A1 | | 3/2002 | Grill et al. | |
| 2002/0098714 A1 | | 7/2002 | Grill et al. | |
| 2002/0137359 A1 | | 9/2002 | Grill et al. | |
| 2002/0180051 A1 | | 12/2002 | Grill et al. | |
| 2003/0064607 A1 | | 4/2003 | Len et al. | |
| 2003/0139062 A1 | | 7/2003 | Grill et al. | |
| 2003/0143865 A1 | | 7/2003 | Hirota et al. | |
| 2003/0198742 A1 | | 10/2003 | Vrtis et al. | |
| 2003/0211728 A1 | | 11/2003 | Mandal | |
| 2003/0232137 A1 | | 12/2003 | Vrtis et al. | |
| 2003/0232495 A1 | | 12/2003 | Moghadam et al. | |
| 2004/0076764 A1 | | 4/2004 | Forester et al. | |
| 2004/0096593 A1 | | 5/2004 | Lukas et al. | |
| 2004/0096672 A1 | | 5/2004 | Lukas et al. | |
| 2004/0101633 A1 | | 5/2004 | Zheng et al. | |
| 2004/0121139 A1 | | 6/2004 | Yim et al. | |
| 2004/0175501 A1 | | 9/2004 | Lukas et al. | |
| 2004/0175957 A1 | | 9/2004 | Lukas et al. | |
| 2004/0235291 A1 | | 11/2004 | Mandal | |

FOREIGN PATENT DOCUMENTS

| | | | |
|---|---|---|---|
| EP | 1 354 980 A1 | | 10/2003 |
| EP | 1 416 501 A2 | | 5/2004 |
| JP | 10256363 | * | 9/1998 |
| WO | WO 01/61737 A1 | | 8/2001 |
| WO | WO 03/088343 A1 | | 10/2003 |
| WO | WO 03/088344 A1 | | 10/2003 |

OTHER PUBLICATIONS

PCT International Search Report and Written Opinion for PCT/US2005/007408, dated Jun. 6, 2005 (AMAT/8204. PCT).
Kloster, "Porosity Effects on Low-K Dielectric Film Strength and Interfacial Adhesion" International Interconnect Technology Conference, Jun. 5, 2002, 17 pages.
Paul S. Ho, "Material Issues and Impact on Reliability of Cu/Low K Interconnects" AVS Chapter Oct. 2002, 50 pages.

* cited by examiner

*Primary Examiner*—Asok Kumar Sarkar
(74) *Attorney, Agent, or Firm*—Patterson and Sheridan

(57) ABSTRACT

A porous dielectric film for use in electronic devices is disclosed that is formed by removal of soluble nano phase porogens. A silicon based dielectric film having soluble porogens dispersed therein is prepared by chemical vapor deposition (CVD) or by spin on glass (S.O.G.). Examples of preferable porogens include compounds such as germanium oxide ($GeO_2$) and boron oxide ($B_2O_3$). Hot water can be used in processing to wet etch the film, thereby removing the porogens and providing the porous dielectric film. The silicon based dielectric film may be a carbon doped silicon oxide in order to further reduce the dielectric constant of the film. Additionally, the porous dielectric film may be treated by an electron beam to enhance the electrical and mechanical properties of the film.

11 Claims, No Drawings

METHOD OF FORMING LOW DIELECTRIC CONSTANT POROUS FILMS

BACKGROUND OF THE INVENTION

1. Field of the Invention

Embodiments of the invention generally relate to a porous dielectric film for use in electronic devices. More particularly, the invention relates to porous dielectric films formed by removal of soluble porogens.

2. Description of the Related Art

The integrated circuit industry constantly reduces the separation between conductive layers of material in order to achieve smaller and faster integrated circuits. As feature sizes in the integrated circuits decrease, problems arise related to signal or resistor/capacitor (RC) delay, increased power consumption, and crosstalk or capacitive coupling between nearby conductors. The capacitive coupling increases noise along nearby conductors, which may be interpreted as a signal causing improper operation of the device that uses the integrated circuit. Decreasing the capacitance between the conductors provides one option for reducing the RC delay and the capacitive coupling. Since the capacitance between two conductors increases substantially in proportion to the dielectric constant (k) of the medium separating them, this can be achieved by using a dielectric film having a low K to separate the conductors.

Silicon dioxide ($SiO_2$), which has a k of approximately 4.0, has long been used in integrated circuits as the primary insulating material. However, the k must be below 4.0 for optimum operation of current and future miniaturized high speed integrated circuits. Certain organic or polymeric materials provide a dielectric material with a lower k than $SiO_2$. However, such materials tend to have limited thermal stability and mechanical strength. A number of carbon doped silicon oxide materials are currently available and provide low k films having a k of around 2.7 or less, such as Black Diamond™ dielectric layers developed by Applied Materials, Inc. Spin on glass (S.O.G.) and chemical vapor deposition (CVD) provide known methods for forming the $SiO_2$ and carbon doped silicon oxide films. However, as the integrated circuits become smaller the dielectric films will require a k below 2.0. Fluoropolymers are known to have a k down to approximately 1.7. However, because of their poor thermal and mechanical properties fluoropolymers are not suitable for use in the manufacture of integrated circuits, where temperatures of 400° C. to 425° C. are normally encountered during subsequent processing steps.

The dielectric constant of dry air is about 1.0. Thus, one way to obtain a material with a low k is to use a porous low dielectric material in which a significant fraction of the bulk volume consists of space or air. In order to obtain a k below 2.0, the dielectric film may require more than 50% meso and nano pores. The effective k is determined by the combination of the k of the air or other gases filling the pores and the k of the dielectric material. Porous dielectric materials may be fabricated in many different structural forms with many different compositions. Therefore, such materials offer the possibility of achieving a low k and having composition and/or structural features resulting in acceptable mechanical, thermal, electrical and chemical properties. Generally, the films require a small pore size in order to maintain mechanical strength and make the film suitable for filling small patterned gaps.

In order to improve the mechanical strength and properties of porous dielectric films, various techniques have been developed. Post cures and coatings have been used to improve mechanical properties without significantly affecting the k of the dielectric layer. For example, exposing a porous dielectric film to an electron beam improves the mechanical strength by decreasing the hardness of the film and improving its modulus of elasticity.

Porous dielectric films have previously been fabricated by a number of different methods. Foams made by blowing air or other gases through a material to create voids or by liberating gas throughout the material provide pores too large to be used in integrated circuits with sub-micron characteristic feature sizes. Sol-gels that are typically based upon hydrolysis and condensation provide another class of porous material used for making a dielectric material. In operation the sol is a colloidal suspension of solid particles in a liquid that transforms into a gel due to growth and interconnection of the solid particles. Thereafter, a pore fluid is evaporated or dried from the gel to provide the porous film. Another alternative method for forming a porous material includes applying a composition having a decomposable polymer or volatile organic compound therein that can be later decomposed or evaporated and removed to form the porous dielectric layer. All of the prior methods for forming porous films have disadvantages that include requiring heating at various stages, precise control of reaction conditions, toxic solutions, and outgasing of unreactive precursors. Heating steps used in creating porous films with prior methods can alter the properties of the integrated circuit.

Therefore, there exists a need for a simple processing method that preferably utilizes non-toxic solutions to provide a porous dielectric material with controlled pore size.

SUMMARY OF THE INVENTION

The invention generally provides a porous dielectric film for use in electronic devices that is formed by removal of soluble nano phase porogens. A silicon based dielectric film having soluble porogens dispersed therein is prepared by chemical vapor deposition (CVD) or by spin on glass (S.O.G.). Examples of porogens include germanium oxide ($GeO_2$) and boron oxide ($B_2O_3$). A benign or non-toxic solution such as hot water can be used in processing to wet etch the film, thereby removing the porogens and providing the porous dielectric film. The silicon based dielectric film may be a carbon doped silicon oxide in order to further reduce the dielectric constant of the film. Additionally, the porous dielectric film may be treated by an electron beam to enhance the electrical and mechanical properties of the film.

DETAILED DESCRIPTION OF THE PREFERRED EMBODIMENT

The invention provides a porous dielectric film for use in electronic devices that is formed by removal of soluble porogens. In one embodiment, a silicon based dielectric film that includes soluble nano phase porogen materials dispersed therein is prepared by chemical vapor deposition (CVD) from a suitable silicon based dielectric precursor composition. Examples of preferable porogen materials include compounds such as germanium oxide ($GeO_2$) and boron oxide ($B_2O_3$). Plasma CVD or low temperature filament CVD with precursors such as organosilicon, organic compounds, organogermanium compounds, organoboron compounds, germanic acid ($GeOH_4$) and/or boric acid ($H_3BO_3$) may be used to form the film. The organosilicon and organic compounds provide the carbon doping to the film while the organogermanium compounds, organoboron compounds, $GeOH_4$ and/or $H_3BO_3$ provide the porogen materials (i.e. $GeO_2$ and/or $B_2O_3$). As such, the film may be a silicon oxide having the porogen materials distributed therein or any of the known carbon doped silicon oxide films having the porogen materials distributed therein. Processing of the film removes the porogen materials to provide a porous film with controlled pore size. A benign or non-toxic solution such as hot water can be used in the processing to remove the porogen materials. Thus, selectively wet etching the film with the benign solution can form the pores in the porous film. In this manner, the processing does not necessitate raising the temperature of the film above the boiling point of the water and does not require outgasing of unreactive precursors.

In another embodiment, a silicon based dielectric film that includes soluble nano phase porogen materials dispersed therein is prepared by spin on glass (S.O.G.) from a suitable silicon based dielectric precursor composition. As with the film formed by CVD, examples of preferable porogen materials include compounds such as $GeO_2$ and $B_2O_3$. The composition applies to a suitable substrate by spin on as is known in the art. Spin on of known S.O.G. materials and controlled size porogen materials (e.g. $GeO_2$ and/or $B_2O_3$ nano particles) produce the film. As such, the film may be a silicon oxide having the porogen materials distributed therein or any of the known carbon doped silicon oxide films having the porogen materials distributed therein. Similar to the film prepared by CVD, processing of the film removes the porogen materials to provide a porous film with controlled pore size. Thus, a benign solution such as hot water can be used in the processing, thereby removing the porogen materials with techniques such as a wet etch. In this manner, the processing never requires raising the temperature of the film above the boiling point of water or outgasing of unreactive precursors.

Porous films prepared by removal of porogen materials as described herein can produce nano porous films with a porosity of greater than forty percent and a dielectric constant of less than 2.0 when the film is a carbon doped silicon oxide film. Optional treating of the porous films prepared by either S.O.G. or CVD and removal of the porogen materials may further enhance the electrical and mechanical properties of the film. For example, treating the film with an electron beam enhances the electrical and mechanical properties of the film.

While the foregoing is directed to embodiments of the invention, other and further embodiments of the invention may be devised without departing from the basic scope thereof, and the scope thereof is determined by the claims that follow.

The invention claimed is:

1. A method for forming a porous dielectric film, comprising:

forming a silicon based film having a water soluble compound dispersed therein, wherein the water soluble compound is boron oxide provided by an organoboron compound introduced while forming the silicon based film; and removing at least a portion of the water soluble compound, thereby providing the porous dielectric film.

2. The method of claim 1, wherein the forming the silicon based film is by chemical vapor deposition (CVD).

3. The method of claim 1, wherein the silicon based film is a carbon doped silcon based film.

4. The method of claim 1, wherein the removing the at least a portion of the water soluble compound is by wet etching the silicon based film.

5. The method of claim 1, further comprising treating the porous dielectric film with an electron beam.

6. The method of claim 1, wherein the dielectric constant of the porous dielectric film is less than 2.0.

7. The method of claim 1, wherein the porosity of the porous dielectric film is at least forty percent.

8. A method for forming a porous dielectric film, comprising:

doping of controlled size nano phase compound in a silicon based film using chemical vapor deposition (CVD), wherein the nano phase compound is boron oxide ($B_2O_3$); and removing at least a portion of the nano phase compound dispersed in the silicon based film, thereby providing the porous dielectric film.

9. The method of claim 8, wherein the silicon based film is a carbon doped silcon based film.

10. The method of claim 8, wherein the nano phase compounds are soluble in water.

11. The method of claim 8, further comprising treating the porous dielectric film with an electron beam.

* * * * *